(12) United States Patent
Rich-Plotkin et al.

(10) Patent No.: US 10,937,517 B1
(45) Date of Patent: Mar. 2, 2021

(54) APPARATUSES AND METHODS TO ENCODE COLUMN PLANE COMPRESSION DATA

(71) Applicant: Micron Technology, Inc., Boise, ID (US)

(72) Inventors: Eric J. Rich-Plotkin, Boise, ID (US); Christopher G. Wieduwilt, Boise, ID (US); Boon Hor Lam, Boise, ID (US); Greg S. Hendrix, Boise, ID (US); Shawn M. Hilde, Meridian, ID (US); Jiyun Li, Boise, ID (US); Dennis G. Montierth, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/685,186

(22) Filed: Nov. 15, 2019

(51) Int. Cl.
| G11C 7/00 | (2006.01) |
| G11C 29/30 | (2006.01) |
| G11C 29/12 | (2006.01) |
| G11C 29/02 | (2006.01) |
| H03M 13/29 | (2006.01) |
| G11C 11/56 | (2006.01) |
| G11C 29/44 | (2006.01) |

(52) U.S. Cl.
CPC .......... *G11C 29/30* (2013.01); *G11C 11/5642* (2013.01); *G11C 29/024* (2013.01); *G11C 29/1201* (2013.01); *H03M 13/2942* (2013.01); *G11C 2029/1208* (2013.01); *G11C 2029/4402* (2013.01)

(58) Field of Classification Search
CPC ... G11C 29/30; G11C 11/5642; G11C 29/024; G11C 29/1201; G11C 2029/1208; G11C 2029/4402; H03M 13/2942
USPC .......................................................... 365/201
See application file for complete search history.

(56) References Cited

U.S. PATENT DOCUMENTS

| 7,457,996 B2* | 11/2008 | Kobayashi | ............. G11O 29/44 365/201 |
| 2009/0249148 A1* | 10/2009 | Ito | ....................... G06F 11/1008 714/746 |

* cited by examiner

*Primary Examiner* — Huan Hoang
(74) *Attorney, Agent, or Firm* — Dorsey & Whitney LLP

(57) ABSTRACT

An exemplary memory includes a memory cell array configured to store a plurality of data bits each associated with a respective column plane, and an input/output circuit including a compression circuit configured to provide error data based on a comparison between a bit of the plurality of data bits received from the memory cell array and an expected value and based on a respective column plane of the memory cell array with which the bit is associated. The compression circuit is further configured to encode a column plane error code based on the error data for provision to a data terminal.

17 Claims, 5 Drawing Sheets

APPARATUSES AND METHODS TO ENCODE COLUMN PLANE COMPRESSION DATA

BACKGROUND OF THE INVENTION

During production and before being placed into service, semiconductor devices (e.g., devices under test) may undergo test operations to detect errors in the semiconductor device. In some examples, a test operation may include performing write-read tests that include writing data to memory cells, reading data back out, and verifying that the read data matches the written data. However, with high density memory, reading out all data from a semiconductor device may consume considerable time and resources of the test equipment to transmit and process the large volume of memory during the read out.

DETAILED DESCRIPTION

Certain details are set forth below to provide a sufficient understanding of embodiments of the present disclosure. However, it will be clear to one skilled in the art that embodiments of the present disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Some of the material described in this disclosure includes circuitry of a semiconductor device that include compression circuitry that is configured to compress output data during test operations. For example, during test operations, data may be written to a memory cell array, and then may be read back out to verify whether the read data matches the written data. Mismatches between the read data and the written data may indicate a defect in a respective cell of the memory cell array. The semiconductor device may include column plane compression circuitry that is configured to perform logical comparisons between bits of the column plane read data or logical comparisons between bits of the column plane read data and expected data to detect errors. The expected data may be externally-supplied (e.g., via a tester) or may be internally stored in registers. Based on the comparisons, the column plane compression circuitry may encode a column plane error code that provides an indication of locations of errors in the column plane data. The column plane error code may indicate whether there are no errors in the column plane data, which of the column planes has an error, whether there are errors across several column planes, error patterns, etc. The column plane error code may be provided to a tester via one or more input/output data terminals of the semiconductor device. In some examples, the column plane error code may be provided to the tester via one or more test input/output data terminals of the semiconductor device that are dedicated for use during test operations. Providing the column plane error code that provides information regarding detected errors may improve an ability to determine a cause of errors as compared with test circuitry that provides a single bit pass/fail flag all column plane error data.

Figure 1:
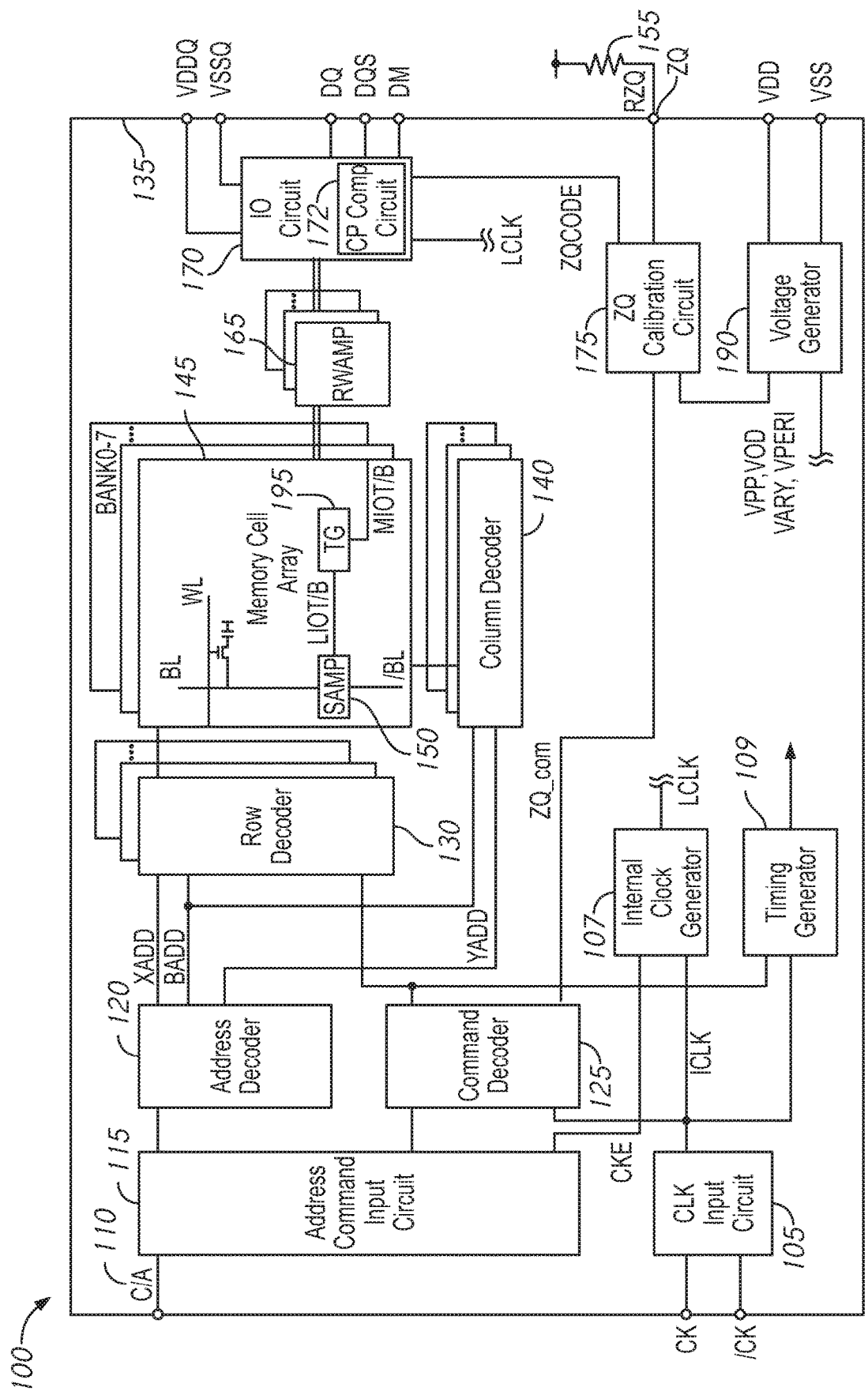
FIG. 1 is a block diagram of a semiconductor device in accordance with an embodiment of the disclosure.

FIG. 1 is a schematic block diagram of a semiconductor device 100, in accordance with an embodiment of the present disclosure. For example, the semiconductor device 100 may include a chip 135 and a ZQ resistor (RZQ) 155. The chip 135 may include a clock input circuit 105, an internal dock generator 107, a timing generator 109, an address command input circuit 115, an address decoder 120, a command decoder 125, a plurality of row decoders 130, a memory cell array 145 including sense amplifiers 150 and transfer gates 195, a plurality of column decoders 140, a plurality of read/write amplifiers 165, an input/output (I/O) circuit 170, a column plane compression circuit 172, the ZQ resistor (RZQ) 155, a ZQ calibration circuit 175, and a voltage generator 190. The semiconductor device 100 may include a plurality of external terminals including address and command terminals coupled to command/address bus 110, clock terminals CK and /CK, data terminals DQ, DQS, and DM, power supply terminals VDD, VSS, VDDQ, and VSSQ, and a calibration terminal ZQ. The chip 135 may be mounted on a substrate, for example, a memory module substrate, a mother board or the like.

The memory cell array 145 includes a plurality of banks BANK0-N, each bank BANK0-N including a plurality of word lines WL, a plurality of bit lines BL, and a plurality of memory cells MC arranged at intersections of the plurality of word lines WL and the plurality of bit lines BL. The number of banks BANK0-N may include 2, 4, 8, 16, or any other number of banks. Each of the banks BANK0-N may divided into two or more memory planes (e.g., column planes). In some examples, each of the banks BANK0-N may include 2, 4, 8, 16, 32, etc., column planes. The selection of the word line WL for each bank is performed by a corresponding row decoder 130 and the selection of the bit line BL is performed by a corresponding column decoder 140. The plurality of sense amplifiers 150 are located for their corresponding bit lines BL and coupled to at least one respective local I/O line further coupled to a respective one of at least two main I/O line pairs, via transfer gates TG 195, which function as switches.

The address/command input circuit 115 may receive an address signal and a bank address signal from outside at the command/address terminals via the command/address bus 110 and transmit the address signal and the bank address signal to the address decoder 120. The address decoder 120 may decode the address signal received from the address/command input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The address/command input circuit 115 may receive a command signal from outside, such as, for example, a memory controller 105 at the command/address terminals via the command/address bus 110 and provide the command signal to the command decoder 125. The command decoder 125 may decode the command signal and provide generate various internal command signals. For example, the internal command signals may include a row command signal to select a word line, a column command signal, such as a read command or a write command, to select a bit line, a mod register setting command MRS that may cause mode register settings to be stored at the mode register data mask generator 126, and a ZQ calibration command ZQ_com that may activate the ZQ calibration circuit 175.

Accordingly, when a read command is issued and a row address and a column address are timely supplied with the read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, together with a data strobe signal at DQS and/or a data mask signal at DM. Similarly, when the write command is issued and a row address and a column address are timely supplied with the write command, and then the input/output circuit 170 may receive write data at the data terminals DQ, together with a data strobe signal at DQS and/or a data mask signal at DM and provide the write data via the read/write amplifiers 165 to the memory cell array 145. Thus, the write data may be written in the memory cell designated by the row address and the column address.

In some examples, the IO circuitry 170 may include a column plane compression circuit 172 that is configured to compress output data during test operations. For example, during test operations, data may be written to the memory cell array 145, and then may be read back out to verify whether the read data matches the written data. Mismatches between the read data and the written data may indicate a defect in a respective cell of the memory cell array 145. To detect errors, the column plane compression circuit 172 may be configured to perform logical comparisons between bits of column plane read data read from the memory cell array 145 or logical comparisons between bits of the column plane read data read from the memory cell array 145 and expected data. The expected data may be externally-supplied (e.g., via a tester) or may he internally stored in registers. Based on the comparisons, the column plane compression circuit 172 may encode a column plane error code that provides an indication of locations of errors in the column plane data. The column plane error code may indicate whether there are no errors in the column plane data, which of the column planes has an error, whether there are errors across several column planes, error patterns, etc. The column plane compression circuit 172 and/or the IO circuit 170 may provide the column plane error code to one or more data terminals DQ for access by a tester. In some examples, column plane compression circuit 172 and/or the IO circuit 170 may provide the column plane error code to one or more test input/output data terminals TDQ of the semiconductor device 100 that are dedicated for use during test operations. Providing the column plane error code that provides information regarding detected errors may improve an ability to determine a cause of errors as compared with test circuitry that provides a single bit pass/fail flag all column plane error data and involves performing several individual column plane read operations to determine which column plane(s) failed.

Turning to the explanation of the external terminals included in the semiconductor device 100, the clock terminals CK and /CK may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170 and a timing generator 109. The IO circuit 170 may use the phase controller internal clock signal LCLK as a timing signal for determining an output timing of read data. The timing generator 109 may receive the internal clock signal ICLK and generate various internal clock signals.

The power supply terminals may receive power supply voltages VDD and VSS. These power supply voltages VDD and VSS may be supplied to a voltage generator circuit 190. The voltage generator circuit 190 may generate various internal voltages, VPP, VOD, VARY, VPERI, and the like based on the power supply voltages VDD and VSS. The internal voltage VPP is mainly used in the row decoder 130, the internal voltages VOD and VARY are mainly used in the sense amplifiers 150 included in the memory cell array 145, and the internal voltage VPERI is used in many other circuit blocks. The power supply terminals may also receive power supply voltages VDDQ and VSSQ. The IO circuit 170 may receive the power supply voltages VDDQ and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170 and the ZQ calibration circuit 175.

The calibration terminal ZQ of the semiconductor memory device 100 may be coupled to the ZQ calibration circuit 175. The ZQ calibration circuit 175 may perform a calibration operation with reference to an impedance of the ZQ resistor (RZQ) 155. In some examples, the ZQ resistor (RZQ) 155 may he mounted on a substrate that is coupled to the calibration terminal ZQ. For example, the ZQ resistor (RZQ) 155 may be coupled to a power supply voltage (VDDQ). An impedance code ZQCODE obtained by the calibration operation may be provided to the IO circuit 170, and thus an impedance of an output buffer (not shown) included in the IO circuit 170 is specified.

Figure 2:
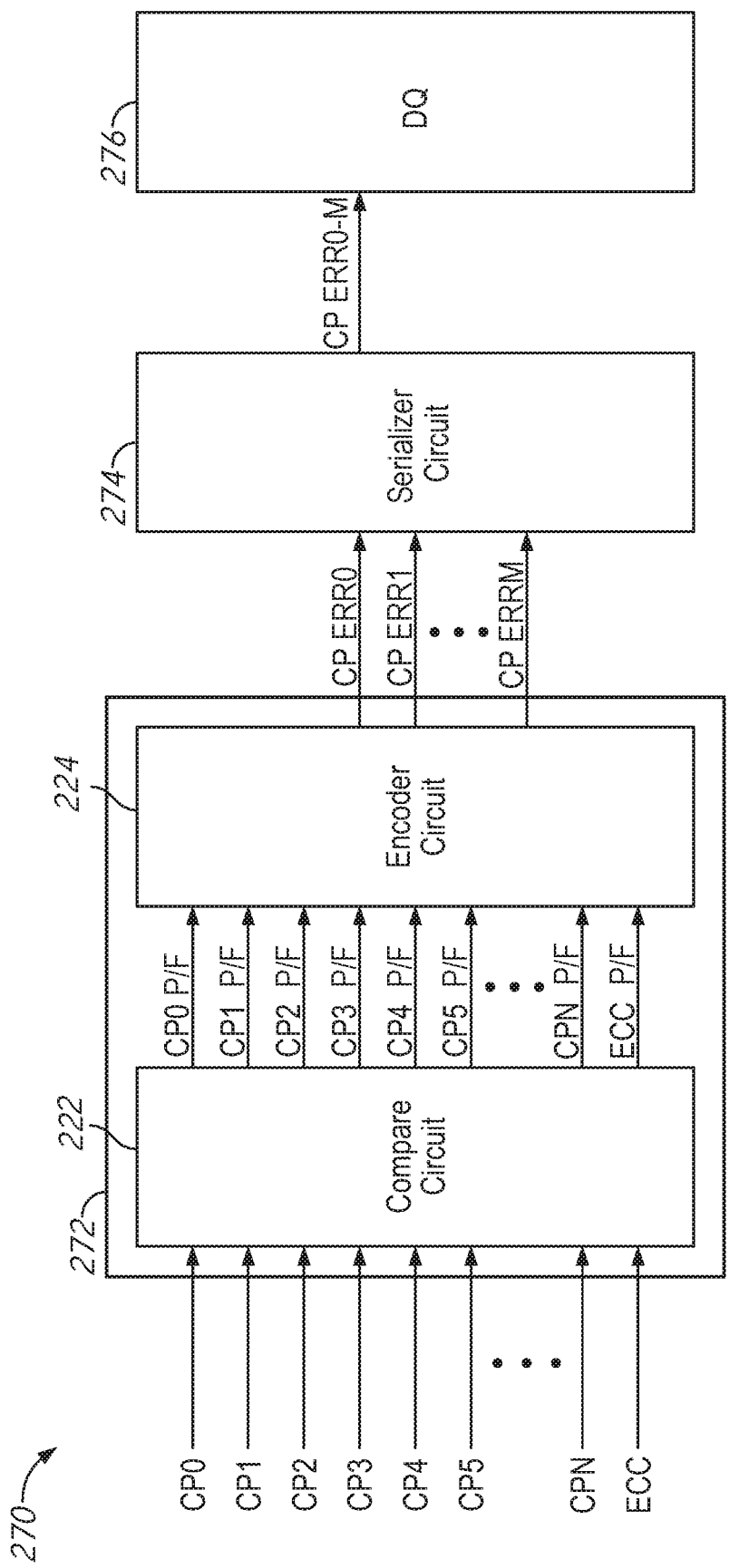
FIG. 2 is a schematic block diagram of a portion of an input/output circuit, in accordance with an embodiment of the present disclosure.

FIG. 2 is a schematic block diagram of a portion of an IO circuit 270, in accordance with an embodiment of the present disclosure. For example, the IO circuit 270 may include a column plane compression circuit 272, a serializer circuit 274, and a data terminal DQ 276. The semiconductor device 100 of FIG. 1 may implement the portion of the IO circuit 270.

The column plane compression circuit 272 may be configured to receive column plane data CP0-CPN and an ECC bit. In some examples, the CP0-CPN and ECC data may include multiple bits of data for each of the column planes. In some examples, a semiconductor device may be implemented without ECC planes. Accordingly, while the foregoing description anticipates inclusion of the ECC data with the column plane data CP0-CPN, it is appreciated that implementations where the column plane compression circuit 272 receives only the column plane data CP0-CPN is within the scope of this disclosure. For example, CP0 may include multiple bits (e.g., 4, 8, 16, etc.) for column plane 0, CP1 may include multiple bits (e.g., 4, 8, 16, etc.) for column plane 1, etc. Thus, in a specific, non-limiting example, if each of the column planes and the ECC circuit provides a respective 8 bits of data, and there are 16 column planes the CP0-CPN, then the CP0-CPN and ECC data may include 136 bits of data.

The column plane compression circuit 272 may include a compare circuit 222 and an encoder circuit 224. The compare circuit 222 may be configured to perform a comparison of the CP0-CPN and ECC data to detect errors. The compare circuit 222 may determine whether the CP0-CPN and error-correcting code (ECC) data includes errors by detecting which bits of the CP0-CPN and ECC data are different than an expected value and provide respective CP0-CPN and ECC pass/fail flags (e.g., bits) for each of the column planes and the ECC plane. In some examples, the expected value may be determined based on a logical value of a majority of bits of the CP0-CPN and ECC data. In other examples, the expected value may be provided to the compare circuit 222 by a tester and/or may be stored or provided internally. The compare circuit 222 may set the CP0-CPN and ECC pass/fail flags for each of the column planes and the ECC based on the detected errors.

The encoder circuit 224 may receive the CP0-CPN and/or ECC pass/fail flags and may encode a CP error code (e.g., CP ERR0-CP ERRM) based on values of the CP0-CPN and ECC pass/fail flags. The CP error code having M+1 bits (e.g., CP ERR0-CP ERRM) includes fewer bits than a count of the column planes and the ECC (e.g., N+2) The encoded value of the CP error code may indicate no column plane failures, a single column plane failure, a pattern of multiple column plane failures, or any combination thereof. For example, in the case of a single CP or ECC failure, the encoder circuit 224 may encode the CP error code with a value that identifies the specific column plane or the ECC. In an example where more than one column plane fails, the encoder circuit 224 may encode a value that indicates multiple column plane failures. In sonic examples, the failure of multiple column planes may have some logical relationship within a semiconductor device that indicates a failure pattern (e.g., sharing common control signals/lines, etc.), and as such, the encoder circuit 224 may encode the CP error code to a value that indicates the failure pattern. The encoder circuit 224 may provide the CP error code to the serializer circuit 274.

The serializer circuit 274 may receive the CP error code bits (e.g., CP ERR0-CP ERRM) in parallel and may serialize the CP error code to provide to a data terminal DQ 276, in some examples. In other examples, bits of the CP error code may be provided in parallel to multiple of the data terminal DQ 276 to be output in parallel. In some examples, in addition to or alternative to providing the CP error code to the data terminal DQ 276, the CP error code may be stored and/or used internally.

In operation, the column plane compression circuit 272 may configured to compress the CP0-CPN data during test operations. For example, during test operations, data may be written to the memory cell array, and then may be read back out to verify whether the read data matches the written data. In some examples, mismatches between the read data and the written data may be used to indicate a defect in a respective cell of the memory cell array (e.g., when a mismatch is an unexpected or unintended result). In some examples, the mismatches may indicate proper operation of various other functions and logic within the semiconductor device (e.g., when a mismatch is an expected or intended result). The column plane compression circuit 272 may be configured to perform logical comparisons between bits of the CP0-CPN and ECC data read from the memory cell array to detect errors, and encode CP error code to provide an indication of locations of errors in the column plane data.

The compare circuit 222 may determine whether the CP0-CPN and ECC data includes errors by determining bits of the CP0-CPN and ECC data are different than an expected value. When a bit is detected to have a different than expected value, the compare circuit 222 may be configured to set one of the respective CP0-CPN and ECC pass/fail flags (e.g., bits) that is associated with the column plane or ECC plane that included the unexpected data. . In some examples, an error may be detected based on logical bitwise comparisons between the bits. In some examples, an expected value may be determined based on a logical value of a majority of bits of the CP0-CPN and ECC data. Thus, if two bits fail a logical bitwise comparison (e.g., an XOR or a NAND bitwise comparison), the bit that is deemed to have failed may be based on which of the two bits has a common logical value with a majority of a selected group of or all of the bits of the CP0-CPN and ECC data. In other examples, the expected value may be externally provided to the compare circuit 222 (e.g., via a tester) and/or may be internally set or stored.

The encoder circuit 224 may receive the CP0-CPN and ECC pass/fail flags and may encode the CP error code based on values of the CP0-CPN and ECC pass/fail flags. In some examples, the encoder circuit 224 includes logic do determine the encoded value of the CP error code. In other examples, the encoder circuit 224 may look up an encoded value in a table based on the CP0-CPN and ECC pass/fail flags. The encoded value of the CP error code may indicate no column plane or ECC failures, a single column plane failure, a pattern of multiple column plane failures, or any combination thereof. For example, in the case of a single CP or ECC failure, the encoder circuit 224 may encode the CP error code with a value that identifies the specific column plane or the ECC. In an example where more than one column plane fails, the encoder circuit 224 may encode a value that indicates multiple column plane failures. In some examples, the failure of multiple column planes may have some logical relationship within a semiconductor device that indicates a failure pattern (e.g., sharing common control signals/lines, etc.), and as such, the encoder circuit 224 may encode the CP error code to a value that indicates the failure pattern. The encoder circuit 224 may provide the CP error code to the serializer circuit 274.

Figure 4:
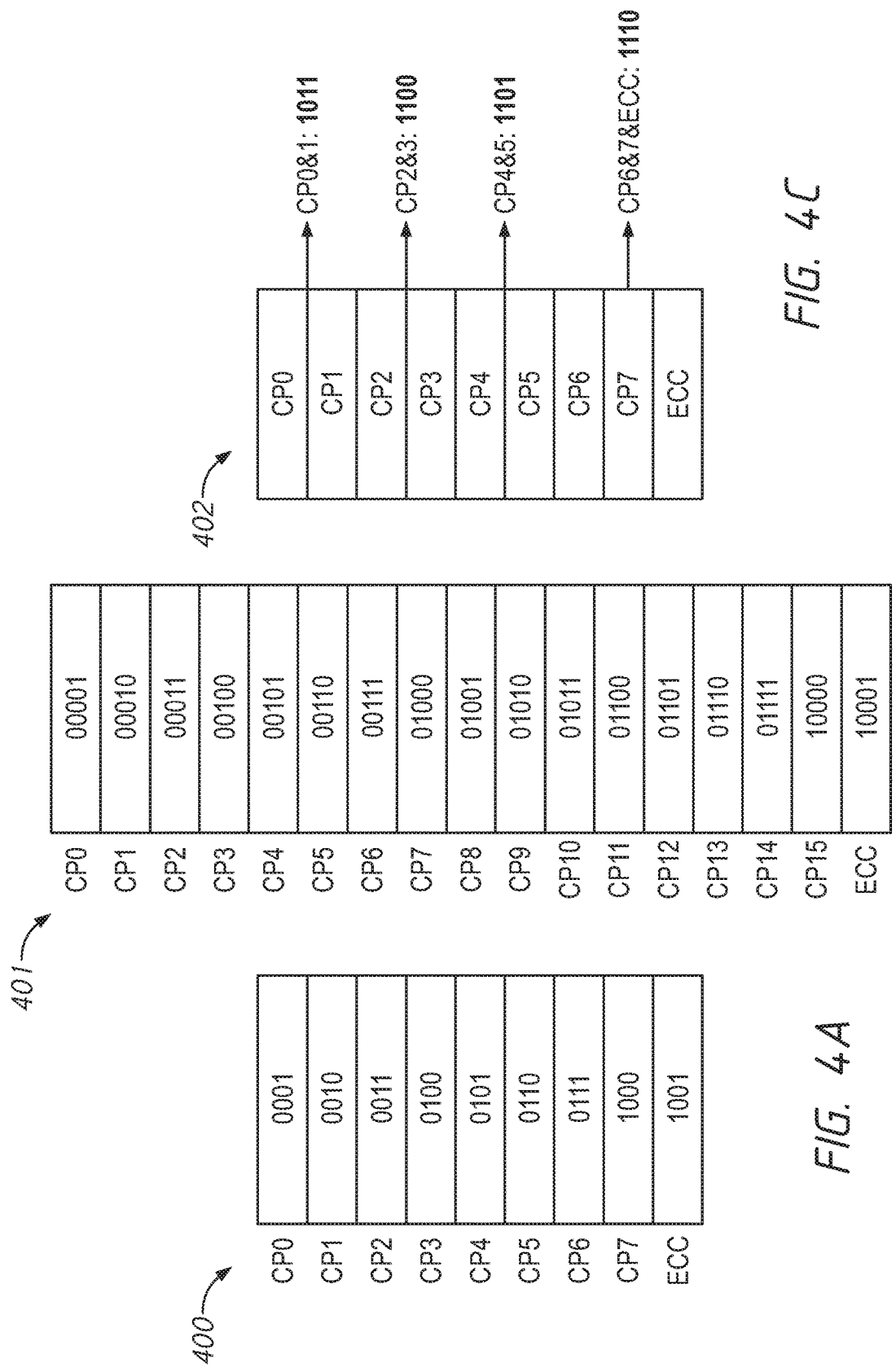
FIGS. 4A-C include tables of exemplary coding of a column plane error code by an encoder circuit, in accordance with embodiments of the disclosure.

FIGS. 4A-C include tables 400, 401, and 402 of exemplary coding of the CP error code by the encoder circuit 224, in accordance with embodiments of the disclosure. The examples provided in FIG. 4A-4C are intended to cover a specific implementation. It is appreciated that coding of the CP error code may be applied to different implementations with more of fewer column planes, with or without ECC planes, with more or fewer CP error code bits, etc., or any combinatin thereof, without departing from the scope of the disclosure. The table 400 in FIG. 4A depicts exemplary CP error code encoding for a semiconductor device that includes 8 column planes and an ECC plane. The implementation of the table 400 includes four bits for a total of 16 different encoded options. In the example of the semiconductor device that includes eight column planes and an ECC plane, ten codes would be used (e.g., no error, one code for each individual column plane, and one code for the ECC), and six codes would remain available to encode other failure modes, such as multiple column plane failures, a multi-column plane failure pattern, combination of ECC and column plane failure, etc., or any combination thereof.

The table 401 in FIG. 4B depicts exemplary CP error code encoding for a semiconductor device that includes 16 column planes and an ECC. The implementation of the table 401 includes five bits for a total of 32 different encoded options. In the example of the semiconductor device that includes with 16 column planes and an ECC, 18 codes would be used (e.g., no error, one code for each individual column plane, and one code for the ECC), and 14 codes would remain available to encode other failure modes, such as multiple column plane failures, a multi-column plane failure pattern, combination of ECC and column plane failure, etc., or any combination thereof.

The table 402 in FIG. 4C depicts an exemplary multi-column plane error CP error code encoding for a semiconductor device that includes 8 column planes and an ECC. Assuming the first ten codes (e.g., b0000 to b1010) are assigned to no error, the eight column planes, and the ECC (e.g., as shown in the table 400 of FIG. 4A) an eleventh code (e.g., b1011) may indicate a failure of both column plane 0 and 1, a twelfth code may indicate a failure of both the column planes 2 and 3, etc.

Note that the encoding examples provided in the tables 400, 401, and 402 of FIG. 4A-4C are exemplary. Different encoding may be implemented without departing from the scope of the disclosure. Also, more or fewer bits may be included in the CP error code than described to allow for more or fewer encoding options.

Figure 3:
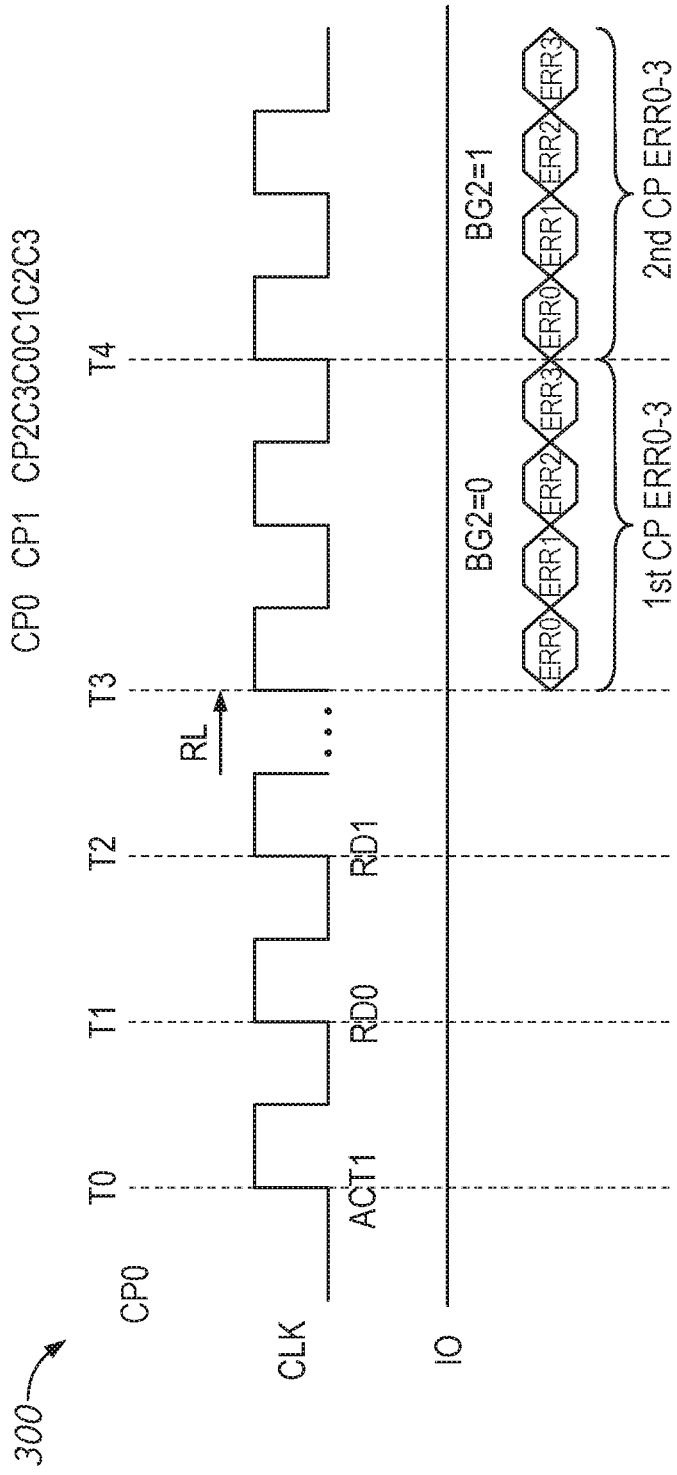
FIG. 3 includes an exemplary timing diagram of a serial transmission of a column plane error code, in accordance with embodiments of the disclosure.

Turning back to FIG. 2, the serializer circuit 274 may receive the CP error code bits (e.g., CP ERR0-CP ERRM) in parallel and may serialize the CP error code to provide to the data terminal DQ 276, in some examples. FIG. 3 includes an exemplary timing diagram 300 of a serial transmission of the CP error code, in accordance with embodiments of the disclosure. At time T0, the semiconductor device receive an activate command ACT to prepare the semiconductor device for a read operation. At times T1 and T2, the semiconductor device receives consecutive first and second read commands RD0 and RD1, respectively. At time T3 after a read latency RL delay, the IO circuit IO circuit 270 (e.g., or the IO circuit 170 of FIG. 1) begins serially transmitting the first CP error code associated with the first read command RD0 at the serializer circuit 274. The serialized first CP error code may be generated by the serializer circuit 274. Immediately following transmission of the last bit of the first CP error code at time T4, the IO circuit IO circuit 270 begins serially transmitting the second CP error code associated with the second read command RD1 at the serializer circuit 274. The serialized second CP error code may he generated by the serializer circuit 274.

In other examples, the bits of the CP error code may be transmitted in parallel or partially in parallel via multiple of the data terminal DQ 276. Providing the column plane error code that provides information regarding detected errors may improve an ability to determine a cause of errors as compared with test circuitry that provides a single bit pass/fail flag all column plane error data and involves performing several individual column plane read operations to determine which column plane(s) failed.

Figure 5:
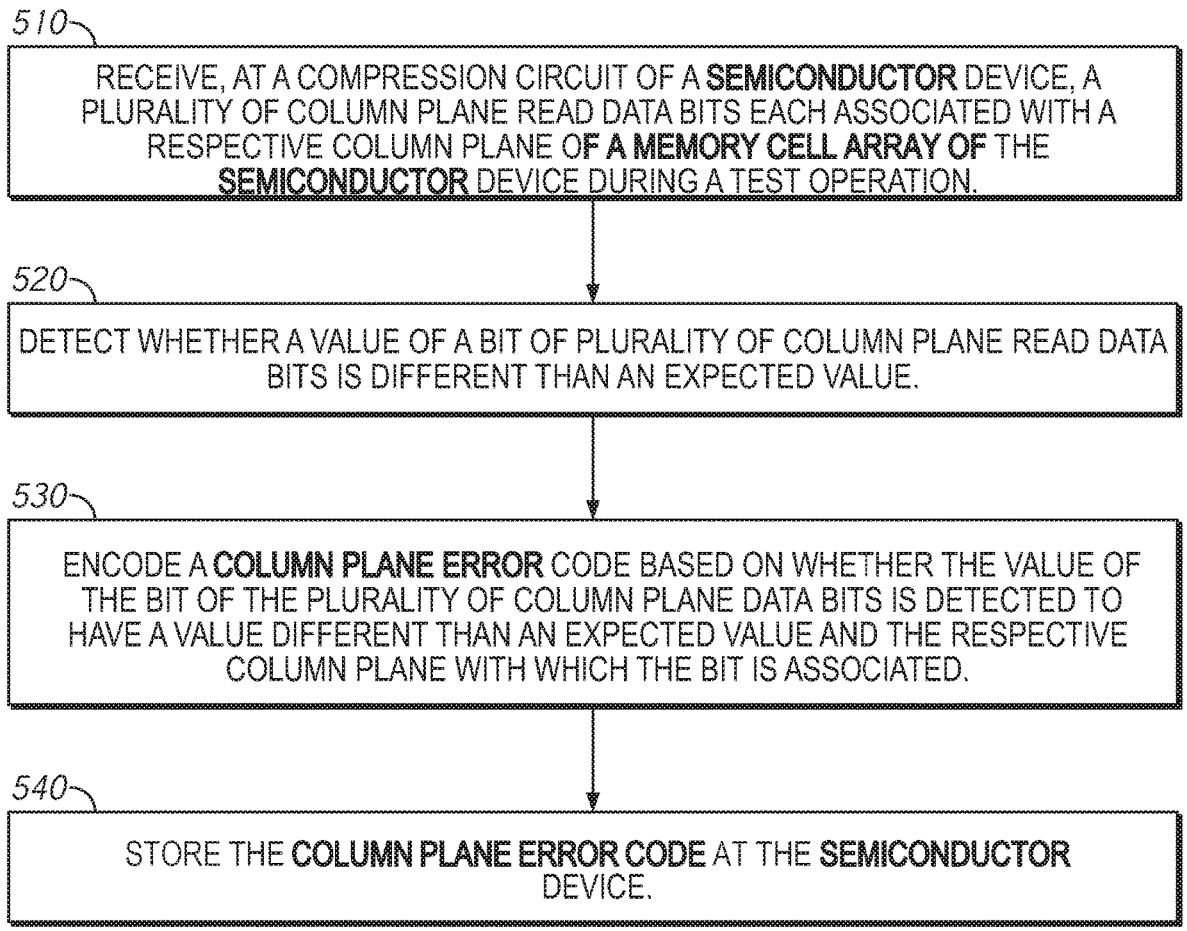
FIG. 5 is a flow diagram of an exemplary method to generate a column plane error code, in accordance with embodiments of the disclosure.

FIG. 5 is a flow diagram of an exemplary method 500 to generate a column plane error code, in accordance with embodiments of the disclosure. The method 500 may be performed by the IO circuit 170 of FIG. 1 and/or the IO circuit 270 of FIG. 2.

The method 500 may include receiving, during a test operation at a compression circuit of a memory device, a plurality of column plane read data bits each associated with a respective column plane of a memory cell array of the memory device, at 510. The compression circuit may be included in the column plane compression circuit 172 of FIG. 1 and/or the compare circuit 222 of FIG. 2. In some examples, the plurality of column. plane read data bits may include the CP0-CPN and ECC data of FIG. 2. In some examples, the method 500 may include, during the test operation, writing the expected data to the memory cell array of the semiconductor device prior to receiving the plurality of column plane read data bits.

The method 500 may further include detecting whether a value of a bit of the plurality of column plane read data bits is different than an expected value, at 520. The detection may be performed by the compare circuit 222 of FIG. 2. In some examples, the compare circuit 222 may provide error data based on a comparison between a bit of the plurality of column plane read data bits received from the memory cell array and the expected value and based on the respective column plane of the memory cell array with which the bit is associated. The error data may include the CP0-CPN and ECC pass/fail flags of FIG. 2. In some examples, the method 500 may include receiving the expected value of the bit from a tester. In some examples, the method 500 may include determining the expected value based on logical bitwise comparisons between the plurality of column plane read data bits. In some examples, the logical bitwise comparisons may include bitwise XOR, comparisons, bitwise NAND comparisons, or combinations thereof between at least two bits of the plurality of column plane read data bits. In some examples, the method 500 may include selecting one of a first logical value or a second logical value as the expected value based on whether more than half of a group of the plurality of column plane read data bits have the first logical value or the second logical value.

The method 500 may further include encoding a column plane error code based on whether the value of the bit of the plurality of column plane read data bits is detected to have the value different than the expected value and based on the respective column plane with which the bit is associated, at 530. The encoding may be performed by the encoder circuit 224 of FIG. 2. The column plane error code may include the CP error code (e.g., CP ERR0-CP ERRM) of FIG. 2. In some examples, the encoding may be performed based on the tables 400, 401, and/or 402 of FIGS. 4A-4C. Other encoding schemes may be implemented without departing from the scope of the disclosure. In some examples, the method 500 may include encoding the column plane error code with a first value in response to the value of the bit of the plurality of column plane read data bits being different than the expected value when the bit is associated with a first column plane, and encoding the column plane error code with a second value in response to the value of the bit of the plurality of column plane read data bits being different than the expected value when the bit is associated with a second column plane.

In some examples, the method 500 may include, in response to the value of the bit of the plurality of column plane read data bits being different than the expected value, encoding the column plane error code with a first value based on the respective column plane with which the bit is associated when all other bits of the plurality of column plane read data bits match the expected value, and encoding the column plane error code with a second value in response to a value of a second bit of the plurality of column plane read data bits being different than the expected value when the second bit is associated with a different respective column plane than the bit.

The method 500 may further include storing the column plane error code at the semiconductor device, at 540. In some examples, the method 500 may further include providing the column plane error code to an output of the semiconductor device and/or to internal logic (e.g., error correcting circuitry, row or column replacement logic, etc.) of the semiconductor device. The output of the semiconductor device may include one or more of the data terminals DQ or test data terminal TDQ of FIG. 1 and/or the data terminal DQ 276 of FIG. 2. In some examples, the output of the semiconductor device is a test data terminal or a data terminal. In some examples, the method 500 may include serializing bits of the column plane error code for provision to the output of the semiconductor device, for use by the internal logic of the semiconductor device, or any combination thereof. The serializing of the bits of the column plane error code may be performed by the serializer circuit 274 of FIG. 2, in some examples.

Although the detailed description describes certain preferred embodiments and examples, it will be understood by those skilled in the art that the scope of the disclosure extends beyond the specifically disclosed embodiments to other alternative embodiments and/or uses of the embodiments and obvious modifications and equivalents thereof. In addition, other modifications which are within the scope of the disclosure will be readily apparent to those of skill in the art. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying mode of the disclosed embodiments. Thus, it is intended that the scope of at least some of the present disclosure should not be limited by the particular disclosed embodiments described above.

What is claimed is:

1. An apparatus comprising:
a compare circuit configured to receive, during a test operation, a plurality of column plane read data bits each associated with a respective column plane of a memory cell array, wherein the compare circuit is further configured to detect whether a value of a bit of the plurality of column plane read data bits is different than an expected value and to provide error data based on the detection and based on the respective column plane of the memory cell array with which the bit is associated, wherein the compare circuit is configured to determine the expected value based on logical bitwise comparisons between the plurality of column plane read data bits; and
an encoder circuit configured to encode a column plane error code based on the error data for provision to a data terminal.

2. The apparatus of claim 1, wherein the compare circuit is configured to receive the expected value of the bit from a tester.

3. The apparatus of claim 1, wherein the logical bitwise comparisons include bitwise XOR, comparisons, bitwise NAND comparisons, or combinations thereof between at least two bits of the plurality of column plane read data bits.

4. The apparatus of claim 1, wherein the compare circuit is configured to select one of a first logical value or a second logical value as the expected value based on whether more than half of a group of the plurality of column plane read data bits have the first logical value or the second logical value.

5. The apparatus of claim 1, further comprising a serializer configured to serialize bits of the column plane error code for provision to the data terminal configured as a test data terminal.

6. An apparatus comprising:
a compare circuit configured to receive, during a test operation, a plurality of column plane read data bits each associated with a respective column plane of a memory cell array, wherein the compare circuit is further configured to detect Whether a value of a bit of the plurality of column plane read data bits is different than an expected value and to provide error data based on the detection and based on the respective column plane of the memory cell array with which the bit is associated; and
an encoder circuit configured to encode a column plane error code based on the error data for provision to a data terminal, wherein the encoder circuit is configured to, in response to the error data indicating that the value of the bit of the plurality of column plane read data bits is different than the expected value and is associated with a first column plane:
encode the column plane error code with a first value based on the first column plane the error data indicates all other bits of the plurality of column plane read data bits matched the expected value; and
encode the column plane error code with a second value in response to the error data indicating that the value of a second bit of the plurality of column plane read data bits associated with a second column plane is different than the expected value.

7. A memory comprising:
a memory cell array configured to store a plurality of data bits each associated with a respective column plane;
an input/output circuit comprising a compression circuit configured to provide error data based on a comparison between a bit of the plurality of data bits received from the memory cell array and an expected value and based on a respective column plane of the memory cell array with which the bit is associated, Wherein the compression circuit is further configured to encode a column plane error code based on the error data for provision to a data terminal, wherein the compression circuit is configured to select one of a first logical value or a second logical value as the expected value based on whether more than half of a group of the plurality of data bits have the first logical value or the second logical value.

8. The memory of claim 7, wherein the compression circuit is configured to:
encode the column plane error code with a first value in response to the error data indicating that the value of the bit of the plurality of data bits is different than the expected value and is associated with a first column plane; and
encode the column plane error code with a second value in response to the error data indicating that the value of the bit of the plurality of data bits is different than the expected value and was associated with a second column plane.

9. A method comprising:
receiving, during a test operation at a compression circuit of a semiconductor device, a plurality of column plane read data bits each associated with a respective column plane of a memory cell array of the semiconductor device;

determining an expected value based on logical bitwise comparisons between the plurality of column plane read data bits;

detecting whether a value of a bit of the plurality of column plane read data bits is different than the expected value;

encoding a column plane error code based on whether the value of the bit of the plurality of column plane read data bits is detected to have the value different than the expected value and based on the respective column plane with which the bit is associated; and storing the column plane error code at the semiconductor device.

10. The method of claim 9, further comprising receiving the expected value of the bit from a tester.

11. The method of claim 9, wherein the logical bitwise comparisons include bitwise XOR, comparisons, bitwise NAND comparisons, or combinations thereof between at least two bits of the plurality of column plane read data bits.

12. The method of claim 9, further comprising selecting one of a first logical value or a second logical value as the expected value based on whether more than half of a group of the plurality of column plane read data bits have the first logical value or the second logical value.

13. The method of claim 9, further comprising:

encoding the column plane error code with a first value in response to the value of the hit of the plurality of column plane read data bits being different than the expected value when the bit is associated with a first column plane; and encoding the column plane error code with a second value in response to the value of the bit of the plurality of column plane read data bits being different than the expected value when the bit is associated with a second column plane.

14. The method of claim 9, further comprising, in response to the value of the bit of the plurality of column plane read data bits being different than the expected value:

encoding the column plane error code with a first value based on the respective column plane with which the bit is associated when all other bits of the plurality of column plane read data bits match the expected value; and encoding the column plane error code with a second value in response to a value of a second bit of the plurality of column plane read data bits being different than the expected value when the second bit is associated with a different respective column plane than the bit.

15. The method of claim 9, wherein the output of the semiconductor device is a test data terminal.

16. The method of claim 9, further comprising, during the test operation, writing data to the memory cell array of the semiconductor device prior to receiving the plurality of column plane read data bits.

17. A method, comprising:

receiving, during a test operation at a compression circuit of a semiconductor device, a plurality of column plane read data bits each associated with a respective column plane of a memory cell array of the semiconductor device;

detecting whether a value of a bit of the plurality of column plane read data bits is different than an expected value;

encoding a column plane error code based on whether the value of the bit of the plurality of column plane read data bits is detected to have the value different than the expected value and based on the respective column plane with which the bit is associated;

storing the column plane error code at the semiconductor device; and serializing bits of the column plane error code for provision to an output of the semiconductor device, for use by internal logic of the semiconductor device, or any combination thereof.

\* \* \* \* \*